(12) United States Patent
Zhang et al.

(10) Patent No.: US 10,580,707 B2
(45) Date of Patent: Mar. 3, 2020

(54) MODULATOR AND DETECTION SYSTEM FOR ARRAY SUBSTRATE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Tao Zhang, Beijing (CN); Haifeng Liu, Beijing (CN); Guoping Qian, Beijing (CN); Hao Shang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/723,665

(22) Filed: Oct. 3, 2017

(65) Prior Publication Data

US 2018/0240717 A1    Aug. 23, 2018

(30) Foreign Application Priority Data

Feb. 22, 2017  (CN) .................... 2017 2 0159576 U

(51) Int. Cl.
*H01L 27/12*  (2006.01)
*H01L 21/66*  (2006.01)
(Continued)

(52) U.S. Cl.
CPC ............ *H01L 22/12* (2013.01); *G02F 1/1309* (2013.01); *G02F 1/13439* (2013.01);
(Continued)

(58) Field of Classification Search
CPC .............. G02F 1/13439; G02F 1/1362; G02F 1/136259; G02F 2001/136254;
(Continued)

(56) References Cited

U.S. PATENT DOCUMENTS

| | | | | |
|---|---|---|---|---|
| 5,365,034 A | * | 11/1994 | Kawamura | .......... G01R 31/311 |
| | | | | 219/121.69 |
| 2012/0196389 A1 | * | 8/2012 | Matsuoka | ............... H01L 22/12 |
| | | | | 438/17 |
| 2017/0023839 A1 | * | 1/2017 | Han | .................. G02F 1/136286 |

* cited by examiner

*Primary Examiner* — Angela K Davison
(74) *Attorney, Agent, or Firm* — Calfee, Halter & Griswold LLP

(57) ABSTRACT

A modulator includes a modulator body, a transparent conductive film, a power supply and a current detection assembly, the modulator body includes an internal electrode and a gold foil layer disposed opposite to each other, and a liquid crystal layer disposed between the internal electrode and the gold foil layer; the transparent conductive film is disposed on a surface of the gold foil layer away from the liquid crystal layer, and a gap is formed between the transparent conductive film and the gold foil layer; the gold foil layer and the transparent conductive film are electrically connected respectively to terminals of different polarities of the power supply, and the current detection assembly is connected in series between the gold foil layer and the power supply, or the current detection assembly is connected in series between the transparent conductive film and the power supply.

18 Claims, 3 Drawing Sheets

(51) Int. Cl.
*G02F 1/1343* (2006.01)
*G02F 1/13* (2006.01)
*G02F 1/1362* (2006.01)

(52) U.S. Cl.
CPC .............. *G02F 1/1362* (2013.01); *G02F 2001/136254* (2013.01); *G02F 2201/123* (2013.01); *G02F 2203/69* (2013.01); *H01L 27/1214* (2013.01)

(58) Field of Classification Search
CPC ..... G02F 2203/69; H01L 22/12; H01L 22/14; H01L 22/34
See application file for complete search history.

MODULATOR AND DETECTION SYSTEM FOR ARRAY SUBSTRATE

CROSS-REFERENCE

The present application is based upon and claims priority to Chinese utility model Application No. 201720159576.1, filed on Feb. 22, 2017, and the entire contents thereof are incorporated herein by reference.

TECHNICAL FIELD

The present disclosure relates to the field of display, and more particularly, to a modulator and a detection system for an array substrate.

BACKGROUND

In order to ensure product quality, it is necessary to detect an array substrate in a display panel during the production of the display panel. During the detection of the array substrate, it is mainly detected whether pixels in the array substrate are normal.

In the related art, the array substrate detection may be performed with a modulator including an internal electrode and a gold foil layer disposed opposite to each other, and a liquid crystal layer between the internal electrode and the gold foil layer. During the detection, the gold foil layer of the modulator gets close to the array substrate, a first voltage is applied to a pixel electrode of the array substrate, and a second voltage is applied to the internal electrode, such that an electric field is formed between the pixel electrode and the internal electrode. Incident light from one side of the array substrate exits from the other side of the array substrate, enters the liquid crystal layer in the modulator through the gold foil layer, and is reflected by the liquid crystal layer. Since normal pixels and defective pixels have different ability to maintain voltage, rotation capacities of the corresponding liquid crystal molecules will be different, and thus intensities of light reflected by the liquid crystal molecules will be different. Therefore, it is possible to determine whether a defect exists in the array substrate according to the intensity of the reflected light.

However, when a foreign matter such as glass debris or large particles exists on the array substrate, the foreign matter may damage the gold foil layer on the lower surface of the modulator, resulting in poor performance of the modulator. Then, the modulator has to be replaced to continue the detection. Therefore, the detection cost for the array substrate is high.

SUMMARY

In a first aspect, there is provided a modulator, including: a modulator body, a transparent conductive film, a power supply and a current detection assembly, wherein the modulator body includes an internal electrode and a gold foil layer disposed opposite to each other, and a liquid crystal layer disposed between the internal electrode and the gold foil layer; the transparent conductive film is disposed on a surface of the gold foil layer away from the liquid crystal layer, and a gap is formed between the transparent conductive film and the gold foil layer; the gold foil layer and the transparent conductive film are electrically connected respectively to terminals of different polarities of the power supply, and the current detection assembly is connected in series between the gold foil layer and the power supply, or the current detection assembly is connected in series between the transparent conductive film and the power supply.

In an embodiment, the modulator further includes an alarm assembly, wherein the alarm assembly is connected to the current detection assembly, and the alarm assembly issues an alarm when a current value detected by the current detection assembly is greater than a reference current threshold. Alternatively, the current detection assembly is an alarm assembly which issues an alarm when a current passing through the alarm assembly is greater than a reference current threshold.

In an embodiment, the modulator further includes a control assembly connected to the modulator body, wherein the control assembly controls the modulator body to stop detection when a current value detected by the current detection assembly is greater than a reference current threshold.

In an embodiment, an orthographic projection of the transparent conductive film on the gold foil layer covers the gold foil layer.

In an embodiment, the transparent conductive film is provided in parallel with the gold foil layer with a gap between the transparent conductive film and the gold foil layer having a width of 10 microns.

In an embodiment, an insulating member is provided at the edge of the gold foil layer or around the gold foil layer, and the transparent conductive film is adhered to the insulating member.

In an embodiment, the insulating member includes a plurality of dot-like insulating structures, and the plurality of dot-like insulating structures is in an annular arrangement.

In an embodiment, the insulating member is made of resin.

In an embodiment, the current detection assembly includes a current sensor or an ammeter.

In a second aspect, there is provided a detection system for an array substrate, including the modulator according to the first aspect.

BRIEF DESCRIPTION OF THE DRAWINGS

In order to more clearly illustrate the technical solution in the embodiments of the present disclosure, the drawings, which are used in the description of the embodiments, will be briefly described below. It will be apparent that the drawings in the following description are merely exemplary embodiments of the present disclosure, and other drawings may be obtained based on these accompanying drawings by those skilled in the art without creative effort.

DETAILED DESCRIPTION

The objects, technical solutions and advantages of the present disclosure will become more apparent from the following description of embodiments of the present disclosure when taken in conjunction with the accompanying drawings.

Figure 1:
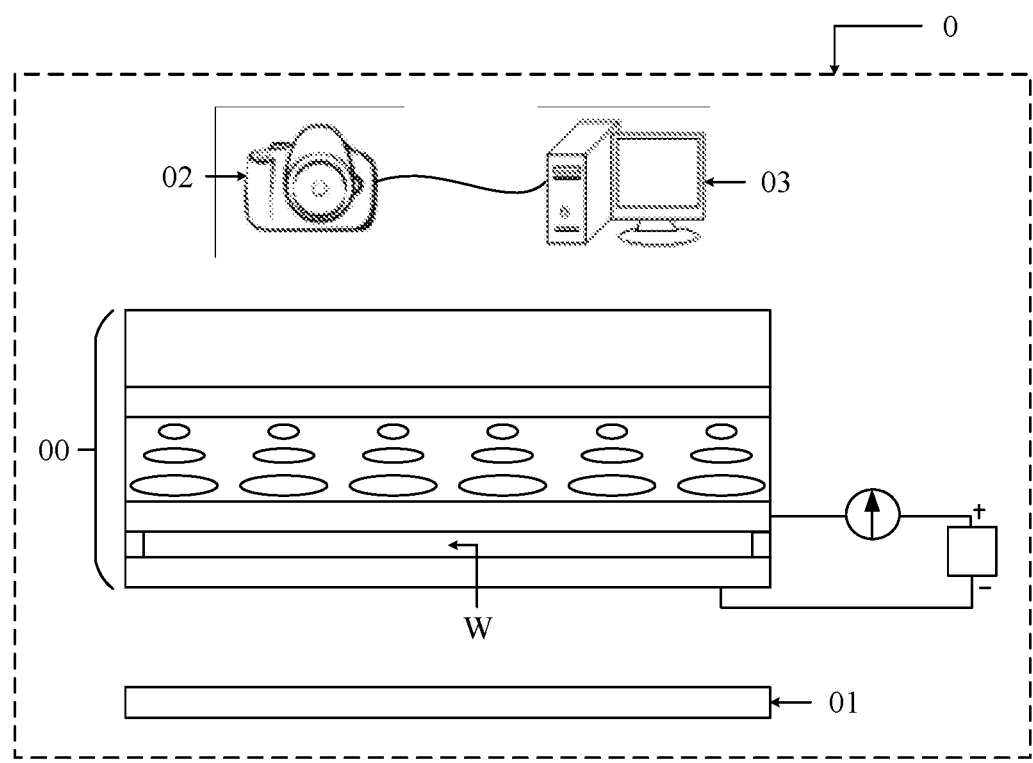
FIG. 1 is a schematic structural diagram of a detection system for an array substrate provided by an embodiment of the present disclosure.

FIG. 1 is a schematic structural diagram of a detection system 0 for an array substrate provided by an embodiment of the present disclosure. As shown in FIG. 1, the detection system 0 includes a modulator 00, a platform 01, a camera 02, a signal processing terminal 03, and other components.

The platform 01 places thereon an array substrate to be detected and provide a light source for the array substrate. The modulator 00 is aligned with the array substrate, and reflect incident light from the array substrate with a liquid crystal layer in the modulator 00. The camera 02 acquires the reflected light. The signal processing terminal 03 calculates a difference between a grayscale of the reflected light and a reference grayscale based on the reflected light acquired by the camera 02, determine whether a defect exists in the array substrate according to the grayscale difference and the position of the reflected light, and when a defect exists in the array substrate, determine the position where there is the defect.

Figure 2A:
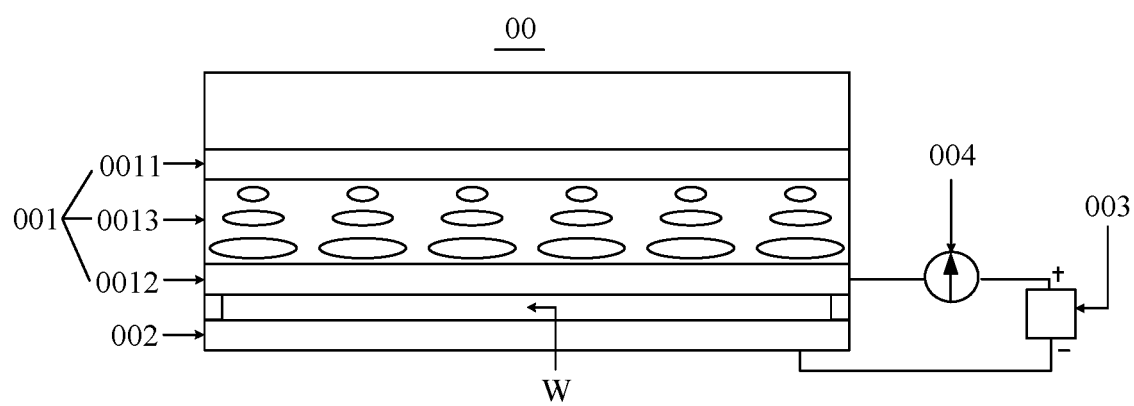
FIG. 2A is a schematic structural diagram of a modulator provided by an embodiment of the present disclosure.

FIG. 2A is a schematic structural diagram of a modulator 00 provided by an embodiment of the present disclosure. As shown in FIG. 2A, the modulator 00 may include: a modulator body 001, a transparent conductive film 002, a power supply 003 and a current detection assembly 004.

The modulator body 001 includes an internal electrode 0011 and a gold foil layer 0012 disposed opposite to each other, and a liquid crystal layer 0013 disposed between the internal electrode 0011 and the gold foil layer 0012.

The transparent conductive film 002 is disposed on a surface of the gold foil layer 0012 away from the liquid crystal layer 0013, and a gap W is formed between the transparent conductive film 002 and the gold foil layer 0012.

The gold foil layer 0012 and the transparent conductive film 002 are electrically connected respectively to the terminals of different polarities of the power supply 003. The current detection assembly 004 is connected in series between the gold foil layer 0012 and the power supply 003. Alternatively, the current detection assembly 004 may be connected in series between the transparent conductive film 002 and the power supply 003. FIG. 2A shows the current detection assembly 004 connected in series between the gold foil layer 0012 and the power supply 003. Here, the current detection assembly 004 may include a current sensor or an ammeter.

Figure 2B:
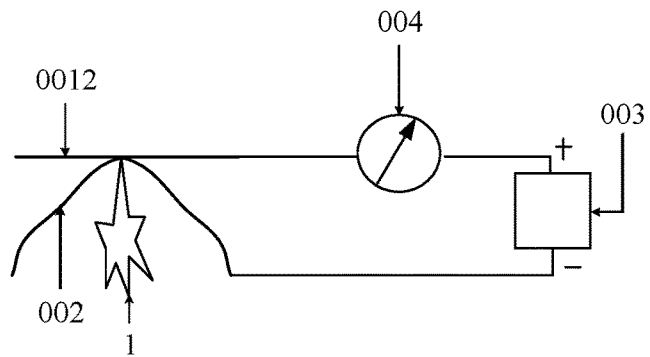
FIG. 2B is a schematic diagram showing a transparent conductive film contacting with a gold foil layer when a foreign matter exists on an array substrate to be detected, according to an embodiment of the present disclosure.

It should be noted that at the beginning of detection, the array substrate to be detected is placed on the platform. The modulator may be placed on a liftable support. The modulator is positioned above the array substrate, and may get close to an upper surface of the array substrate with the support under control of a machine or manually until a distance between a bottom surface of the modulator and the upper surface of the array substrate is a preset detection distance (for example, 50 microns). At this time, the movement of the modulator is stopped, and a voltage is applied to the internal electrode of the modulator to control the rotation of the liquid crystal molecules in the liquid crystal layer, and in turn to cause the liquid crystal layer to reflect light. However, during the movement of the modulator, if a foreign matter exists on the array substrate to be detected, the foreign matter will inevitably contact the transparent conductive film before contacting the gold foil layer and protrude the transparent conductive film, which make the transparent conductive film to deform toward the gold foil layer, and in turn bring the transparent conductive film in contact with the gold foil layer. Since the gold foil layer and the transparent conductive film are electrically connected respectively to terminals of different polarities of the power supply, when the transparent conductive film is in contact with the gold foil layer, a current path is formed between the transparent conductive film, the gold foil layer and the power supply. At this time, the current detection assembly may detect a current, the schematic diagram of which is shown in FIG. 2B, in which the numeral reference 1 denotes the foreign matter. That is, during the detection, it may be determined that a foreign matter exists on the array substrate based on that the current detection assembly has detected a current, and then a corresponding process may be performed, to protect the gold foil layer from being damaged by the foreign matter. In an embodiment, the process may be controlling the modulator to be removed from a current position, or after the foreign matter is cleared, controlling the modulator to detect again.

Accordingly, in the modulator provided by the embodiment of the present disclosure, the transparent conductive film is disposed on the surface of the gold foil layer away from the liquid crystal layer. When a foreign matter exists on the array substrate to be detected, the foreign matter will protrude the transparent conductive film, to bring the transparent conductive film in contact with the gold foil layer to form a current path, so that the current detection assembly may detect a current. Then, it may be determined that a foreign matter exists according to the detection result of the current detection assembly and a corresponding process may be performed. Compared with the related art, the probability of the foreign matter on the array substrate damaging the gold foil layer of the modulator may be reduced, and the cost of array substrate detection may be reduced accordingly.

Figure 3:
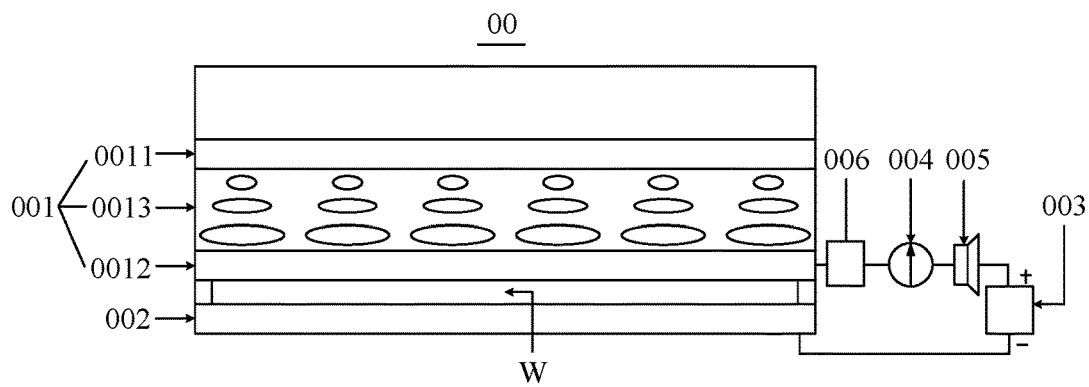
FIG. 3 is a schematic structural diagram of another modulator provided by an embodiment of the present disclosure.

In practical application, the modulator 00 may be provided with a assembly for alarming. On one hand, as shown in FIG. 3, the modulator 00 may also include an alarm assembly 005. The alarm assembly 005 is connected to the current detection assembly 004. The alarm assembly 005 issues an alarm according to the detection result of the current detection assembly 004 when the current value detected by the current detection assembly 004 is greater than a reference current threshold, to indicate that a foreign matter exists on the array substrate, and then a corresponding process is performed. For example, the alarm assembly may be an alarm device that may generate an alarm such as sound and/or light, for example, a buzzer, a speaker and a warning light (e.g., a light emitting diode).

On the other hand, the current detection assembly 004 may be an alarm assembly that may issue an alarm when a current passing through the alarm assembly is greater than a reference current threshold. For example, the alarm assembly may trigger an alarm function when the current value is greater than the reference current threshold, and be in a sleep state when the current value is less than or equal to the reference current threshold. For example, the alarm assembly may be an alarm device that may generate an alarm such as sound and/or light, for example, a buzzer, a speaker and a warning light (e.g., a light emitting diode).

Figure 4:
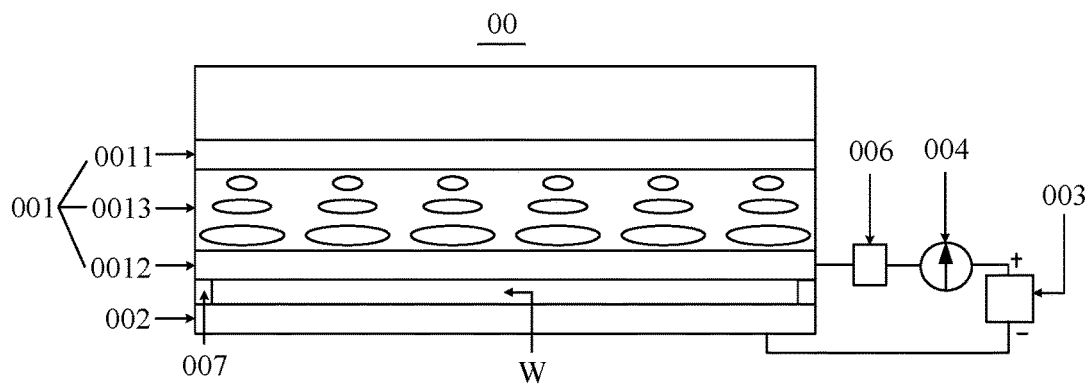
FIG. 4 is a schematic diagram of a further modulator provided by an embodiment of the present disclosure.

In an embodiment, the modulator 00 may also include a control assembly 006. The control assembly 006 is connected to the modulator body 001, and controls the modulator body 001 to stop detection when the current value detected by the current detection assembly 004 is greater than the reference current threshold. As shown in FIG. 3, the control assembly 006 may control the modulator body 001 to stop detection based on the detection result of the current detection assembly 004, or may control the modulator body 001 to stop detection based on the alarm issued by the alarm assembly 005. Alternatively, as shown in FIG. 4, it is possible that the modulator 00 does not include the alarm assembly 005. In this case, the control assembly 006 may control the modulator body 001 to stop detection based on the detection result of the current detection assembly 004. For example, the control assembly 006 may be a control device such as a relay or an overcurrent protector. The control assembly is provided to enable an automatic control of stopping the detection, to avoid damaging the gold foil layer of the modulator.

It should be noted that when the current value detected by the current detection assembly is greater than the reference current threshold, the detection of the modulator body may be manually controlled to be stopped. This is not specifically limited by the embodiment of the present disclosure.

Further, in the above modulator, an orthographic projection of the transparent conductive film 002 on the gold foil layer 0012 may cover the gold foil layer 0012. This arrangement ensures that the transparent conductive film may completely cover the gold foil layer to keep the foreign matter on the array substrate away from contacting the gold foil layer. That is, the foreign matter may not damage the gold foil layer.

In order to further ensure that the foreign matter does not damage the gold foil layer, the transparent conductive film 002 may be provided in parallel with the gold foil layer 0012 to ensure that the width of a gap between the entire transparent conductive film and the entire gold foil layer is uniform. For example, the gap width may be 10 microns.

Figure 5A:
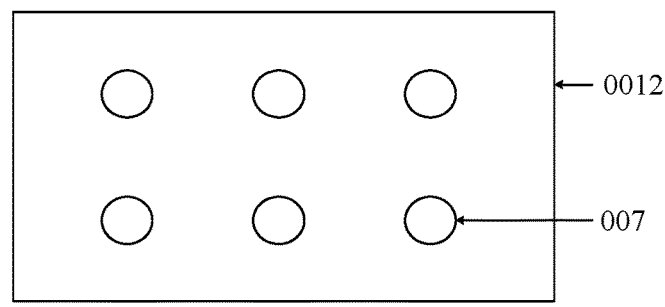
FIG. 5A is a schematic top view of an insulating member and a gold foil layer when the insulating member is disposed in an internal region of the surface of the gold foil layer, according to an embodiment of the present disclosure.
Figure 5B:
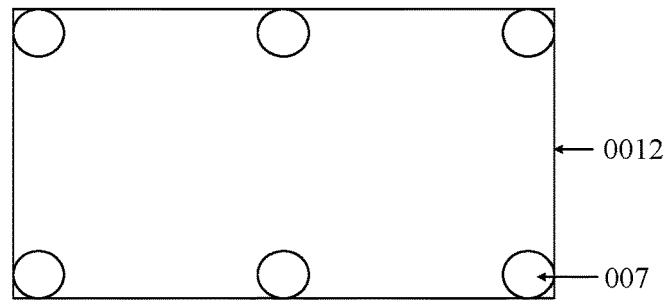
FIG. 5B is a schematic top view of an insulating member and a gold foil layer when the insulating member is disposed at the edge of the gold foil layer, according to an embodiment of the present disclosure.
Figure 5C:
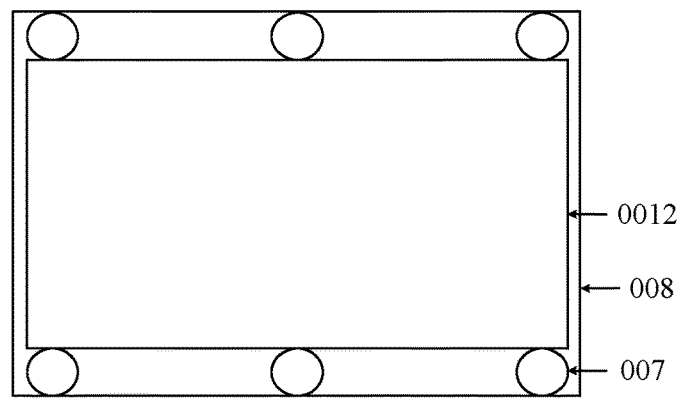
FIG. 5C is a schematic top view of an insulating member and a gold foil layer when the insulating member is disposed around the gold foil layer, according to an embodiment of the present disclosure.

In an embodiment, the transparent conductive film 002 may be provided on the surface of the gold foil layer 0012 away from the liquid crystal layer 0013 through an insulating member 007. That is, one end of the insulating member 007 is adhered to the transparent conductive film 002, and the other end is attached to the gold foil layer 0012, and the position thereof may refer to FIG. 4. The insulating member is provided so that a gap may be formed between the transparent conductive film and the gold foil layer, and the insulation between the transparent conductive film and the gold foil layer may also be ensured. For example, the insulating member 007 may be disposed in the inner region of the surface of the gold foil layer 0012, and the top view of the insulating member 007 and the gold foil layer 0012 may refer to FIG. 5A. Alternatively, the insulating member 007 may be provided at the edge of the gold foil layer 0012, and the corresponding top view may refer to FIG. 5B. Alternatively, the insulating member 007 may be disposed around the gold foil layer 0012, and the corresponding top view may refer to FIG. 5C. As shown in FIG. 5C, the gold foil layer 0012 and the insulating member 007 are provided on a bottom surface 008 of the modulator body, and the insulating member 007 is disposed around the gold foil layer 0012. When the insulating member is disposed at the edge of the gold foil layer or around the gold foil layer, the insulating member may block the transmission of the light as little as possible. It ensures that the light may be effectively transmitted.

The insulating member may include a plurality of dot-like insulating structures. In practical application, the insulating member may be made of a viscous material, and the insulating member may be connected to the transparent conductive film and the gold foil layer, respectively, with its viscidity. Alternatively, the insulating member may be made of a material which is not viscous. In this case, the insulating member and the transparent conductive film, and the insulating member and the gold foil layer may be connected by adhesion. For example, two ends of the insulating member may be adhered respectively to the transparent conductive film and gold foil layer by insulating adhesive. For example, the insulating member may be made of resin.

In an embodiment, the plurality of dot-like insulating structures may be in an annular arrangement, and such an arrangement not only ensures effective light transmission, but also that when there is a foreign matter on the array substrate to be detected, the transparent conductive film may be effectively protruded by the foreign matter, and the transparent conductive film may be effectively deformed. Moreover, the plurality of dot-like insulating structures may uniformly share the gravity of the transparent conductive film, thereby ensuring effective adhesion to the transparent conductive film.

Accordingly, in the modulator provided by the embodiment of the present disclosure, the transparent conductive film is disposed on the surface of the gold foil layer away from the liquid crystal layer. When a foreign matter exists on the array substrate to be detected, the foreign matter will protrude the transparent conductive film, to bring the transparent conductive film in contact with the gold foil layer and form a current path, so that the current detection assembly may detect the current. Then, it may be determined that a foreign matter exists according to the detection result of the current detection assembly and a corresponding process may be performed. Compared with the related art, the probability of the foreign matter on the array substrate damaging the gold foil layer of the modulator may be reduced, and the cost of array substrate detection may be reduced accordingly.

An embodiment of the present disclosure also provides a detection system for an array substrate, and the schematic structural diagram thereof may refer to FIG. 1. The detection system 0 for an array substrate may include a modulator 00 as described in any one of FIG. 2A, 3 or 4.

It should be noted that the detection system 0 for the array substrate may include a platform 01, a camera 02, a signal processing terminal 03, and the other components. In an embodiment, the camera 02 may be a camera of a Charge Coupled Device (CCD).

Accordingly, in the modulator provided by the embodiment of the present disclosure, the transparent conductive film is disposed on the surface of the gold foil layer away from the liquid crystal layer. When a foreign matter exists on the array substrate to be detected, the foreign matter will protrude the transparent conductive film, to bring the transparent conductive film in contact with the gold foil layer and form a current path, so that the current detection assembly may detect the current. Then, it may be determined that a foreign matter exists according to the detection result of the current detection assembly and a corresponding process may be performed. Compared with the related art, the probability of the foreign matter on the array substrate damaging the gold foil layer of the modulator may be reduced, and the cost of array substrate detection may be reduced accordingly.

It will be understood by those of ordinary skill in the art that all or part of the steps of implementing the embodiments described above may be accomplished by hardware or by means of a program instructing a corresponding hardware. The program may be stored in a computer readable storage medium. The mentioned storage medium may be a read-only memory, a magnetic disk, an optical disk or the like.

The foregoing are merely preferred embodiments of the present disclosure and are not intended to limit the present disclosure, and any modifications, equivalent substitutions, improvements, and the like within the spirit and principles of the present disclosure are intended to be encompassed within the range of the present disclosure.

What is claimed is:

1. A modulator for detecting an array substrate, comprising: a modulator body, a transparent conductive film, a power supply and a current detection assembly, wherein the modulator body comprises an internal electrode and a gold foil layer disposed opposite to each other, and a liquid crystal layer disposed between the internal electrode and the gold foil layer; the transparent conductive film is disposed on a side of the gold foil layer away from the liquid crystal layer, and a gap is formed between the transparent conductive film and the gold foil layer; the gold foil layer and the transparent conductive film are electrically connected respectively to terminals of different polarities of the power supply, and the current detection assembly is connected in series between the gold foil layer and the power supply, or the current detection assembly is connected in series between the transparent conductive film and the power supply; wherein during detection of the array substrate, when the transparent conductive film is displaced by foreign matter such that the transparent conductive film is in contact with the gold foil layer, a current detectable by the current detection assembly is generated.

2. The modulator according to claim 1, wherein an orthographic projection of the transparent conductive film on the gold foil layer covers the gold foil layer.

3. The modulator according to claim 1, wherein the transparent conductive film is provided in parallel with the gold foil layer with the gap between the transparent conductive film and the gold foil layer having a width of 10 microns.

4. The modulator according to claim 1, wherein the current detection assembly comprises a current sensor or an ammeter.

5. The modulator according to claim 1, wherein the current detection assembly comprises an alarm assembly configured to issue an alarm when a current passing through the alarm assembly is greater than a reference current threshold.

6. The modulator according to claim 5, wherein an insulating member is provided at an edge of the gold foil layer or around the gold foil layer, and the transparent conductive film is adhered to the insulating member.

7. The modulator according to claim 1, further comprising a control assembly connected to the modulator body, wherein
the control assembly is configured to control the modulator body to stop the detection of the array substrate when a current value detected by the current detection assembly is greater than a reference current threshold.

8. The modulator according to claim 7, wherein an insulating member is provided at an edge of the gold foil layer or around the gold foil layer, and the transparent conductive film is adhered to the insulating member.

9. The modulator according to claim 1, further comprising: an alarm assembly, wherein
the alarm assembly is connected to the current detection assembly, and the alarm assembly is configured to issue an alarm when a current value detected by the current detection assembly is greater than a reference current threshold.

10. The modulator according to claim 9, further comprising a control assembly connected to the modulator body, wherein
the control assembly is configured to control the modulator body to stop the detection of the array substrate when a current value detected by the current detection assembly is greater than a reference current threshold.

11. The modulator according to claim 9, wherein an insulating portion is provided at an edge of the gold foil layer or around the gold foil layer, and the transparent conductive film is adhered to the insulating member.

12. The modulator according to claim 1, wherein an insulating member is provided at an edge of the gold foil layer or around the gold foil layer, and the transparent conductive film is adhered to the insulating member.

13. The modulator according to claim 12, wherein the insulating member comprises a plurality of dot-like insulating structures, and the plurality of dot-like insulating structures is in an annular arrangement.

14. The modulator according to claim 13, wherein the insulating member is made of resin.

15. A detection system for an array substrate, comprising the modulator according to claim 1.

16. The detection system for an array substrate according to claim 15, wherein the modulator further comprises an alarm assembly, the alarm assembly is connected to the current detection assembly, and the alarm assembly is configured to issue an alarm when a current value detected by the current detection assembly is greater than a reference current threshold.

17. The detection system for an array substrate according to claim 15, wherein the current detection assembly comprises an alarm assembly configured to issue an alarm when a current passing through the alarm assembly is greater than a reference current threshold.

18. The detection system for an array substrate according to claim 15, wherein the modulator further comprises a control assembly connected to the modulator body, and the control assembly is configured to control the modulator body to stop detection of the array substrate when a current value detected by the current detection assembly is greater than a reference current threshold.

* * * * *